(12) United States Patent
Dawson et al.

(10) Patent No.: US 7,380,191 B2
(45) Date of Patent: May 27, 2008

(54) ABIST DATA COMPRESSION AND SERIALIZATION FOR MEMORY BUILT-IN SELF TEST OF SRAM WITH REDUNDANCY

(75) Inventors: James W. Dawson, Poughkeepsie, NY (US); Thomas J. Knips, Wappingers Falls, NY (US); Donald W. Plass, Poughkeepsie, NY (US); Kenneth J. Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 11/054,566

(22) Filed: Feb. 9, 2005

(65) Prior Publication Data

US 2006/0179377 A1 Aug. 10, 2006

(51) Int. Cl.
*G01R 31/28* (2006.01)
*G01C 29/00* (2006.01)
(52) U.S. Cl. .................. 714/733; 714/736; 714/718
(58) Field of Classification Search ............... None
See application file for complete search history.

(56) References Cited

U.S. PATENT DOCUMENTS

| | | | | |
|---|---|---|---|---|
| 5,337,318 A | 8/1994 | Tsukakoshi et al. | ......... | 371/5.5 |
| 5,535,164 A | 7/1996 | Adams et al. | ............. | 365/201 |
| 5,557,619 A * | 9/1996 | Rapoport | ................ | 714/733 |
| 5,633,877 A | 5/1997 | Shephard, III et al. | .... | 371/22.2 |
| 5,790,559 A | 8/1998 | Sato | ........................ | 371/21.3 |
| 5,859,804 A | 1/1999 | Hedberg et al. | ............ | 365/201 |
| 5,961,653 A | 10/1999 | Kalter et al. | ................... | 714/7 |
| 6,058,084 A * | 5/2000 | Yamamoto et al. | ........... | 360/51 |
| 6,594,788 B1 | 7/2003 | Yasui | ........................ | 714/710 |
| 6,917,762 B2 * | 7/2005 | Kim | ........................ | 398/158 |
| 7,076,706 B2 * | 7/2006 | Eckelman et al. | .......... | 714/726 |
| 7,146,108 B2 * | 12/2006 | Kim | ........................ | 398/155 |
| 2002/0157051 A1 * | 10/2002 | Eckelman et al. | .......... | 714/736 |
| 2005/0047229 A1 * | 3/2005 | Nadeau-Dostie et al. | ... | 365/201 |

OTHER PUBLICATIONS

U.S. Appl. No. 10/814,719, filed on Mar. 31, 2004.
U.S. Appl. No. 11/053,812, filed on Feb. 9, 2005.

* cited by examiner

*Primary Examiner*—Phung M. Chung
(74) *Attorney, Agent, or Firm*—Cantor Colburn LLP; Lynn Augspurger

(57) ABSTRACT

A method and apparatus for implementing ABIST data compression and serialization for memory built-in self test of SRAM with redundancy. The method includes providing detection signals asserted for one failing data out, two failing data outs, and greater than two failing data outs. The method also includes individually encoding the failing bit position of each corresponding failing data out with a binary representation value corresponding therewith. The method further includes serializing results of the providing detection signals and the individually encoding, and transmitting results of the serializing to a redundancy support register function on a single fail buss.

6 Claims, 4 Drawing Sheets

ABIST DATA COMPRESSION AND SERIALIZATION

ABIST DATA COMPRESSION AND SERIALIZATION FOR MEMORY BUILT-IN SELF TEST OF SRAM WITH REDUNDANCY

BACKGROUND OF THE INVENTION

1. Field of the Invention

The invention described herein relates generally to integrated circuit testing, and more particularly, to memory array built in self testers for random access memory arrays with redundancy circuits for failure relief.

2. Description of Background

In order to test RAM macros, e.g., SRAM macros with redundant elements for failure relief, by means of Array Built-In Self Test (ABIST), the data from the array is usually compared to expected data generated by the self test ABIST function. To this end, the ABIST circuitry is used for test vector generation of address and data, and subsequent comparison circuitry is used to provide a bit wise fail vector corresponding to each of the data-outs of the memory array, or device under test. This additional circuitry is either embedded in the SRAM or provided in surrounding logic.

This fail vector, or the situation of determining that a failure has occurred, is then processed to establish if the failure can be repaired using the redundant elements/circuitry of the memory array under test. This processing for establishing the redundant element configuration for failure relief is traditionally handled "off-chip" by various test equipment apparatus and peripheral computer software analysis of the component under test as described in U.S. Pat. No. 6,594,788 entitled "Method of Analyzing a Relief of Failure Cell in a Memory and Memory Testing Apparatus Having a Failure Relief Analyzer Using the Method" issued on Jul. 15, 2003, and U.S. Pat. No. 5,790,559, entitled "Semiconductor Memory Testing Apparatus" issued on Aug. 4, 1998.

Similarly, apparatus involving large memory storage (e.g., equal to the target memory array) can be used to support memory IC testing with redundant circuits as described in U.S. Pat. No. 5,337,318 issued to Tsukakoshi et al. Tsukakoshi recites a method for processing and determining repairability of the target memory array.

The memory array redundant elements can be provided in a plurality of configurations, usually based on the overall size of the memory array macro, addressing configuration, and the number of data outs provided. Memory arrays can be viewed as three dimensional binary storage elements: considering a row dimension and a column dimension to describe an array of memory cells, and this array of cells can be replicated to provide for a plurality of data input/output bits, each composed of the two dimensional array of memory cells. To generalize the categories for background purposes here, DRAM macros (due to the high number of memory bits) will usually contain a plurality of column and word addressable redundant elements. That is, both spare rows of memory cells and spare columns of memory cells are provided for relief of manufacturing defects, each spanning the total number of data input/output pins for the memory array.

SRAM macros are generally smaller in total size and, due to the larger memory cell requirements, are generally provided fewer spare elements, although these elements may be provided as both column and row addressable elements. In fact, due to generally fewer column addressable elements of a high speed SRAM macro, column addressable spare or redundant elements become costly in terms of the overall number of memory array cells. Therefore, a secondary scheme of column spare elements can be provided by providing spare data inputs/outputs or some fraction of a data bit group of cells, as disclosed by Davis et al. in patent application Ser. No. 10/814,719, entitled "Skip Over Redundancy Decode with Very Low Overhead" which was filed on Mar. 31, 2004, assigned to the Assignees of the present invention and is incorporated herein by reference in its entirety. A more general case is to reduce the number of repair actions, or to limit the redundant elements to a single dimension of row addressable or column addressable elements only.

The support for two dimensional redundancy allocation is growing more complex for SRAM memory arrays with increased data I/O widths (i.e., number of data bits into and out of the array) and the increased number of repair actions desired for yield improvement on high speed, high density SRAM product.

In addition, redundant elements in the SRAM macros are not restricted to just the address or data bit dimensions, but are now increasingly utilizing the column addressing and data bit architecture of the SRAM. The thrust here has been to keep the size of the redundant element as small as possible for low overhead and high area efficiency, while increasing the overall number of repair actions available for failure relief of the memory array.

Therefore, it is becoming increasingly important to determine with more specificity where a failure has occurred in a memory array, for subsequent processing and generation of a failure relief condition of the memory array. A clear need exists to reduce the complexity of the logic and process to establish a repairable configuration of a memory array with redundant elements, and thereby reduce the test time and cost required. There is also a clear need to reduce the circuit overhead of the test compare, as well as the processing for establishment of the redundant element configuration for failure relief of memory arrays with redundant circuits.

SUMMARY OF THE INVENTION

The shortcomings of the prior art are overcome and additional advantages are provided through the provision of a method and apparatus for implementing ABIST data compression and serialization for memory built-in self test of SRAM with redundancy. The method includes providing detection signals asserted for one failing data out, two failing data outs, up to a number 'N' failing data outs. The method also includes individually encoding the failing bit position of each corresponding failing data out with a binary representation value corresponding therewith. The method further includes serializing results of the provided detection signals and the individually encoded representation, and transmitting results of the serializing to a redundancy support register function on a single fail bus.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Specifically, the apparatus of the invention makes use of conventional bit-by-bit comparison of self test generated data vectors to data read from the memory. This establishes a vector of compare results, where individual bits represent failures from the corresponding data bits of the memory array. This vector may contain a plurality of failures that need to be processed by downstream redundancy allocation logic. The proposed method and apparatus reduces the dependency of the downstream redundancy allocation logic to simultaneously process a plurality of memory array bit failures. The method and apparatus employs on chip logic to individually strip off each failing bit position for binary encoding, to reduce the overall amount of failure storage bits of a data register relating to each fail, and to serialize these encoded data register values into each of several clock cycles for casting out and processing individually, thereby greatly reducing the requirements and complexity of the redundancy allocation process block for failure relief within the memory array.

The apparatus of the invention, when combined with a traditional self test engine (ABIST) used for test vector generation of address and data, and subsequent comparison circuitry used to provide a bit wise fail vector corresponding to each of the data-outs of the memory array, or device under test, provides a built-in, on-chip in-situ at speed test system for testing a memory array with redundancy circuits for failure relief.

Figure 1:
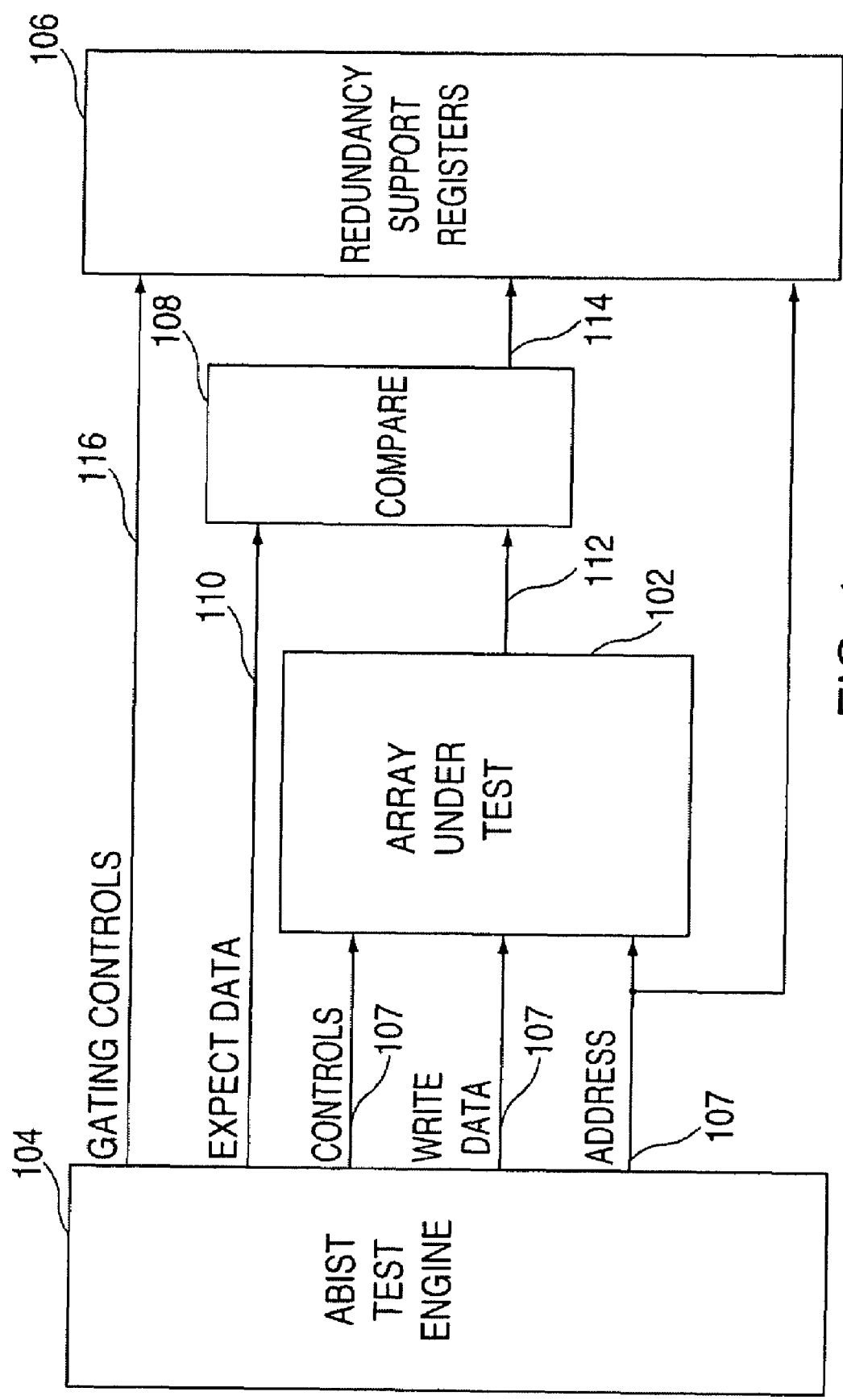
FIG. 1 illustrates a typical ABIST implementation represented by memory array test system support elements and their configuration in the prior art.

FIG. 1 shows a typical ABIST implementation represented by memory array test system support elements and their configuration. The redundancy allocation support described herein is, but not restricted to, two dimensional in reference to the row and column addressing within the structure of the memory array 102 under test. There may exist a plurality of redundant row and column elements thus supported by the redundancy support registers 106. The self test engine 104 provides the deterministic array test patterns 107. The compare function 108 has as its inputs, the expected data vector 110 and the memory array outputs 112. It provides an overall pass/fail result signal 114 which is used in combination with the gating controls 116 from the self test engine 104 to control the redundancy support registers 106 in establishing real time redundancy allocation.

Figure 2:
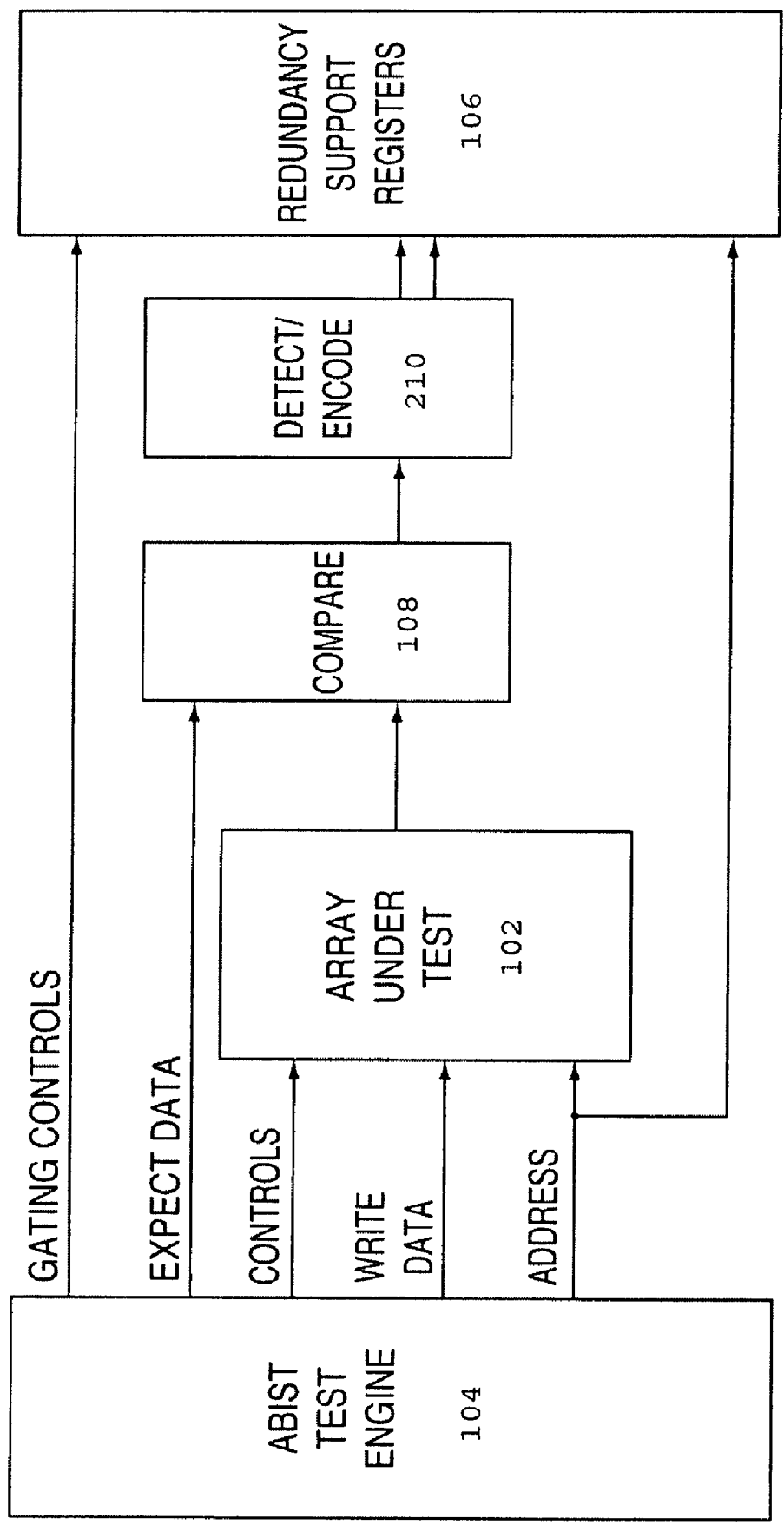
FIG. 2 illustrates another variation of an ABIST element configuration in the prior art which includes support elements used again, but not restricted to, in support of two dimensional memory array redundancy allocation.

FIG. 2 shows another variation of an ABIST element configuration with support elements identically labeled as in FIG. 1 and used again, but not restricted to, in support of two dimensional memory array redundancy allocation. The exception here, is that there may exist a plurality of row and what will be referred to as column group elements within the memory array structure. These column group elements are not selected by memory array column addressing alone, but instead coincide with a data input/output element in whole or in part.

In this art, one of the redundant/repairable element dimensions corresponds to an array I/O in whole or in part. The compare element no longer compresses the test result to a single pass/fail signal, but instead provides individual result signals for each memory array data-out. The Detect/Encode circuit element 210 is thus employed to determine memory array fail repairability, first by signaling that one and only one repairable element is failing and then providing an encoded representation, or "effective" address to be processed by the two dimensional redundancy support register. Again, not all memory array addressing bits may be needed by the redundant element allocation register, only those sufficient to uniquely describe/address the redundant element invocation.

Figure 3:
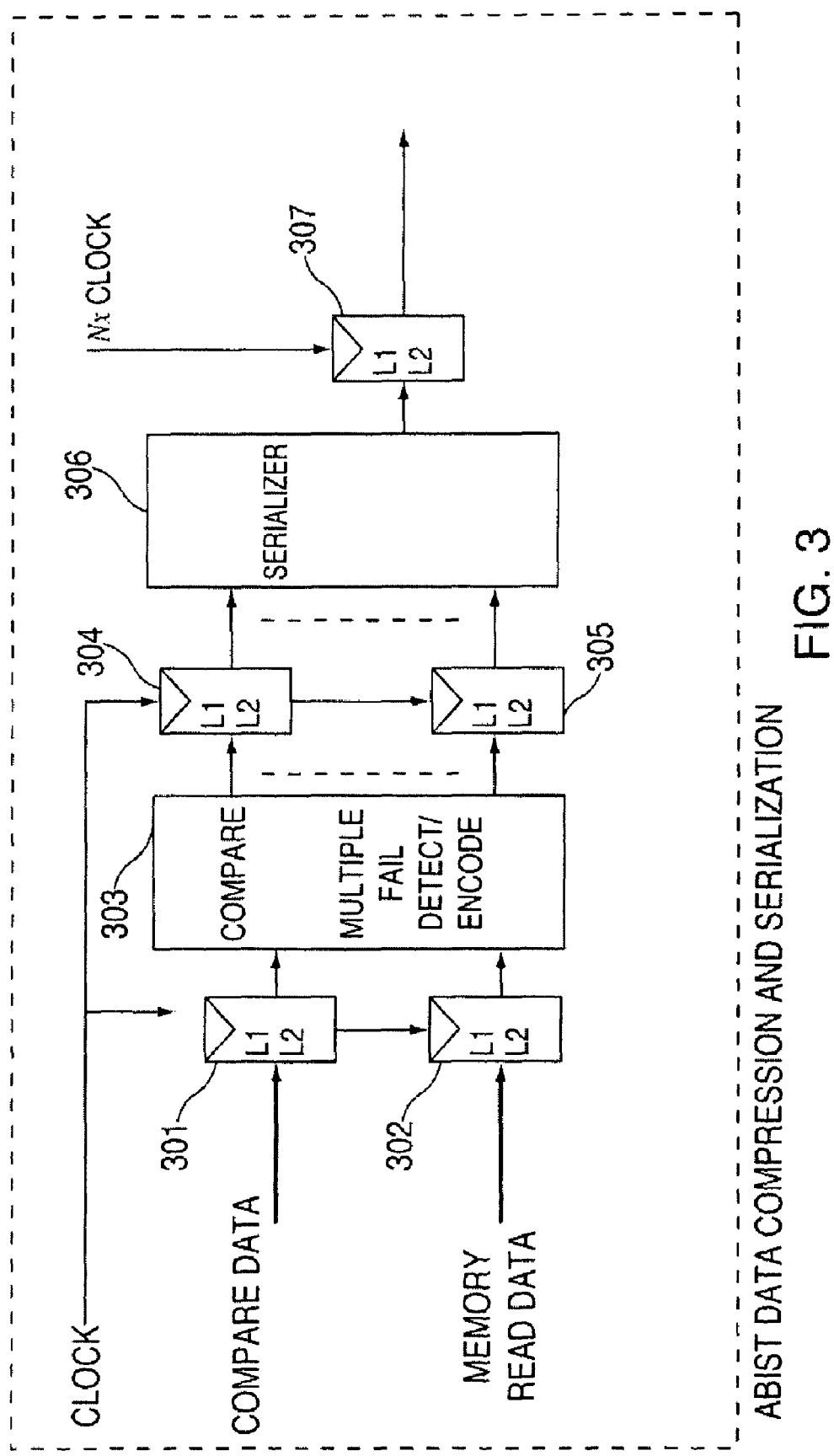
FIG. 3 illustrates a block diagram of a system for implementing ABIST Data Compression in exemplary embodiments.

FIG. 3 shows a preferred embodiment implementation of the proposed system of ABIST Data Compression. The preferred embodiment will be described herein with relation to existing ABIST implementations, such as those described in patents which are mentioned below and incorporated herein by reference, including U.S. Pat. No. 5,633,877, entitled "Programmable Built-In Self-Test Controller for Arrays" issued to Huott et al.; U.S. Pat. No. 5,961,653 entitled "Processor based BIST for an embedded memory" issued to Dreibelbis et al. on Oct. 5, 1999; and U.S. Pat. No. 5,535,164 entitled "BIST Tester for Multiple Memories" issued to Adams et al. (referred to herein as the ABIST test engine). Dreibelbis describes an integrated chip having a DRAM embedded in logic that is tested by an in-situ processor oriented BIST macro. The BIST is provided with two ROMS, one for storing test instructions and a second, which is scannable, that provides sequencing for the test instructions stored in the first ROM, as well as branching and looping capabilities. The BIST macro has, in addition, a redundancy allocation logic section for monitoring failures within the DRAM and for replacing failing word and/or data lines. By stacking the DRAM in 0.5 mb increments up to a 4.0 mb maximum or in 1.0 mb increments up to an 8 mb maximum, all of which are controlled and tested by the BIST macro, a customized chip design with a high level of granularity can be achieved and tailored to specific applications within a larger ASIC.

The preferred embodiment of our proposed invention, regarding the primary function of the ABIST data compression and serialization, replaces the traditional compare block shown in FIG. 1, and the associated compare and detect and encode blocks shown in FIG. 2 as will now be described.

To this point, it has been detailed that for traditional redundancy support, the ABIST Compare function, is used to implement an N-bit compare of the data-out bus of the memory array macro (dataouts 0:N) and the expect data bus 0:N from ABIST test engine as shown in prior art FIGS. 1 and 2. Overall ABIST error detection is then accomplished as an N-way logical 'OR' determining if any mis-compare has occurred on a cycle by cycle basis. This signal is also referred to as the 'rtfail' or real time fail signal. For memory array applications with two dimensional redundancy, whereby one dimension is in terms of row addressing, and the second dimension is in terms of column addressing across one or all data bits of the memory array, then this compare result bus or overall error detection provides for a sufficient determination of a fail and location for purposes of result propagation to the redundancy support registers as shown in FIG. 1. For large SRAM macros with column addressing greater than 32 columns, there is potential for column level redundancy with reasonable overhead, and for even greater numbers of columns, (with a necessary reduction in the number of available data input/output bits) there is practical opportunity for multiple column repair or redundant elements.

For SRAM memory array applications with two dimensional redundancy, whereby one dimension is in terms of addressing, and the second dimension is in terms of column addressing and, or, all or part of a memory data out, herein referred to as a column group, then the compare result bus and overall error detection needs additional processing as shown in FIG. 2 to provide for a sufficient determination of a fail and location for purposes of result propagation to the redundancy support registers. This additional processing takes the form of detection if one or more of the memory data outs are failing, and the encode of the failing data out bits to a reduced form of binary address representation of the failing data out. It will be noted here that for high performance SRAM with a high number of data input/output bits, that this consideration for encoding becomes more desirable in reducing overall test hardware requirements.

It has been a traditional limitation in two dimensional redundancy circuits of large SRAM macros, that providing multiple column repairable elements is too costly in terms of spare element overhead (efficiency) and in terms of performance impacts, and in the detection and allocation these redundant elements for failure relief within the memory array. Recent developments now provide techniques for the practical capability of multiple column redundant or multiple column repairable memory array elements for SRAM macros, as disclosed in patent application Ser. No. 11/053,812, entitled "Method and Apparatus for Implementing Multiple Memory Column Redundancy" filed concurrently herewith, assigned to the Assignees of the present invention, and is incorporated herein by reference in its entirety.

Therefore, the ABIST data compression apparatus provides an efficient on chip solution for enabling the detection of multiple simultaneous failures from an access of an SRAM memory array, the encoding of these failures, and the provision of necessary signal interfaces to downstream redundancy support registers. This is accomplished in the preferred embodiment by supplementing the traditional "OR" of the individual compare result bits described earlier, with three functions described further herein. This description will be for the case of two failing data bits, but the proposed apparatus and method is not restricted to only two, but can be applied to any number N that is greater than one. In a practical sense, the most desirable cases currently forecast are in the range of two to three.

Referring now to FIG. 3, registers 301 and 302 are pipelining stages illustrated to maintain time alignment of the compare data or expected data vector generated by the ABIST engine 104, and the data vector read from the memory array 102. A bit by bit compare of these vectors is performed within the first stage of block 303 shown, resulting in a vector of mis-comparing or failing bits only. The first main function is the multiple fail detect portion of the block 303, which identifies the number of failing bits contained in the vector for processing and control of the serializer 306. The second main function is to individually encode the failing bit positions. The first failing bit position in the vector is encoded and held in register 304. Subsequent failing bit positions are also encoded and held in like registers up to block 305. The third main function is to serialize the detected and encoded fails for transmission of the multiple fails on a single fail bus. Serializer 306 is used in conjunction with the higher clock rate output register 307 to cast out individually encoded fails once per cycle.

Figure 4:
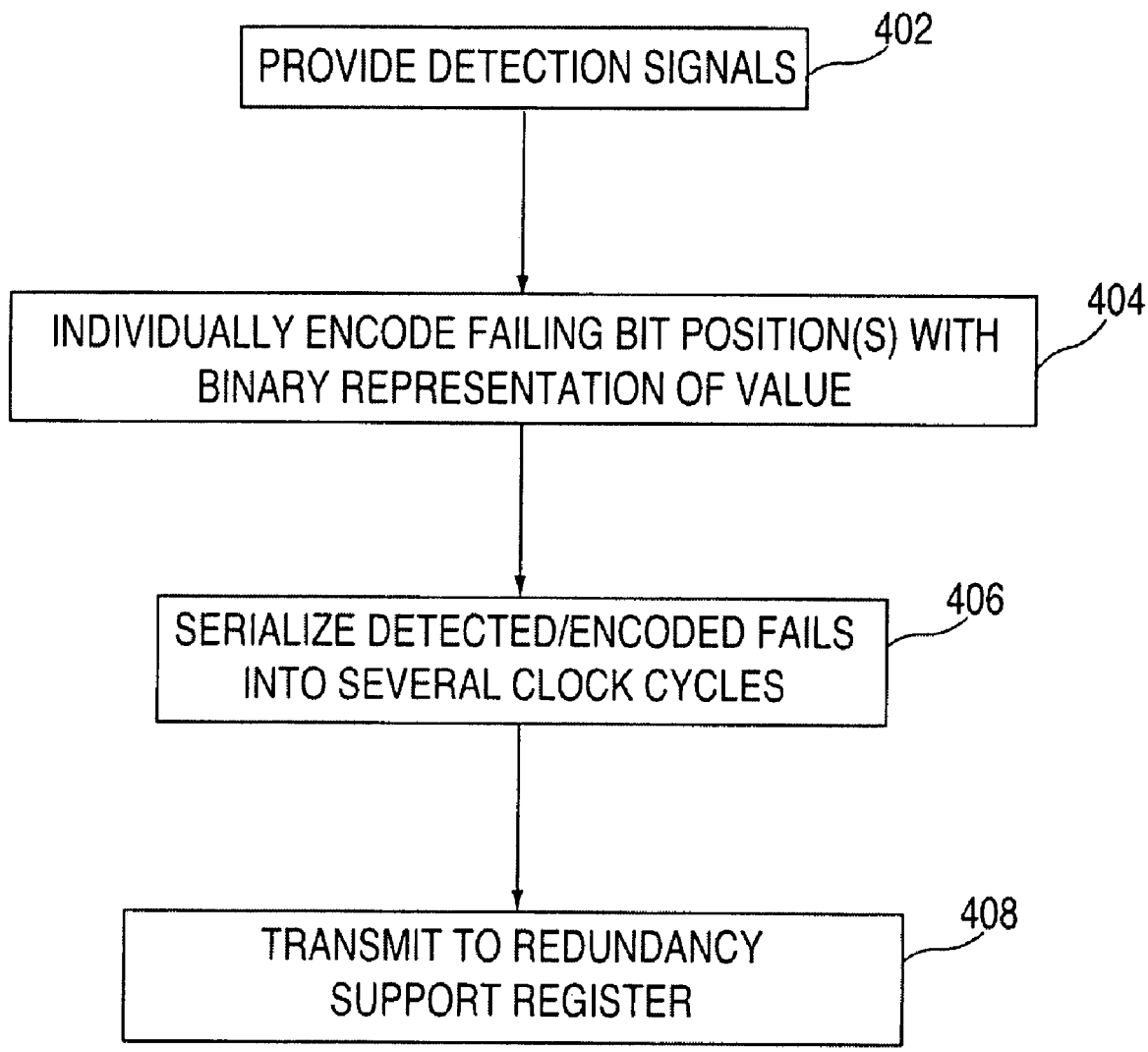
FIG. 4 is a flow diagram describing a process for implementing the ABIST Data Compression in exemplary embodiments.

Turning now to FIG. 4, a process for implementing the ABIST data compression will now be described with respect to the three aforementioned functions. At step 402, for the example embodiment, detection signals are asserted for one, and only one failing data out, two failing data outs, and greater than two (or N) failing bits. At step 404, the failing bit position(s) or index of the data out bus (i.e., the failing data out number) are individually encoded with a binary representation of the value, thus reducing the number of register bits required to store the failing value.

At step 406, the detected and encoded fails are serialized for transmission to the redundancy support register function (step 408) on a single fail bus enabling treatment of the multiple fail case (up to N) to be handled as multiple occurrences of the single fail case. This greatly simplifies the required redundancy support registers configuration requirements to the traditional single fail case, maintaining simplicity, performance, and reduced area for the increased function of the multiple redundant element case for failure relief within the memory array.

Referring back to step 402, the signal asserted high for one and only one failing data out, is used in conjunction with the signal asserted high for two failing data outs, to control the multiplexor and serialization block to cast out the first failing data bit encoded representation in the first of the serialized cycles, followed by the encoded representation of the second failing databit in the second serialization cycle. Again, there is no restriction of this technique to just two serialized cycles as described, any number N greater than one can be accommodated with the proposed methodology.

When and if the number of simultaneously failing data outs exceed the number of column group repairable or redundant elements provided within the memory array, then an additional signal is asserted, referred to as the greater than 2 (or N) signal used to assert the multi-bit or 'must fix row' signal that is fed downstream to the redundancy support registers.

Referring back to step 404, the encoding may be accomplished by separating the failing bit positions of the compare results into individual fields each containing only one failing bit position. This "stripping off" of the first failing bit positions individually allows for separate binary encodes, repeated to support up to N allowable encodes.

Referring back to step 406, the serializing is accomplished by providing register clocks at a higher rate than the SRAM macro that is being tested. This, in combination with a multiplexing function to source the N binary encoded representations of the failing data bit positions, along with the aforementioned control signals provide a sufficient configuration. This requirement provides very little restriction on most large SRAM applications requiring two dimensional redundancy for failure relief within the memory array. Due to the size and performance of the large SRAM in high speed processor chip applications, the SRAM generally is clocked at a slower frequency than the surrounding core or processor logic. Keeping these elements of the proposed apparatus at the higher clock rate can easily accommodate this proposed function.

The significant advantage of this method and apparatus of ABIST data compression and serialization is to provide a consistent and simplified interface to the redundancy support registers of an SRAM with two dimensional redundancy for failure relief within the memory array. For any single access of the SRAM, a single data bit, or multiple data bit failures that may occur are cast off to the downstream redundancy support registers as a stream of individual bit failures for processing by the redundancy support registers.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for compressing and serializing data for use in self-testing, comprising:

providing detection signals asserted for one failing data out, two failing data outs, and greater than two failing data bit outs;

individually encoding the failing bit position of each corresponding failing data out with a binary representation value corresponding therewith; and serializing results of the providing detection signals and the individually encoding, wherein the serialized results are used for self-testing of an SRAM.

2. The method of claim 1, wherein the results of the serializing are transmitted to the redundancy support register function on a single fail bus.

3. The method of claim 2, wherein the serializing is accomplished by:

providing register clocks functioning at a higher rate than a functioning rate associated with an SRAM macro under test; and implementing a multiplex operation for sourcing binary encoded representations of failing data bit positions.

4. The method of claim 2, wherein in response to the transmitting results on a single fail bus, treating a multiple fail case as multiple occurrences of a single fail case resulting in reduced redundancy support register configuration requirements.

5. The method of claim 1, wherein the detection signal asserted for one failing data out is used in conjunction with the signal asserted for two failing data outs for causing a multiplexor and serialization component to cast out failing bits, the method further comprising:

eliminating a first failing data bit encoded representation in a first serialized cycle; and eliminating a second failing data bit encoded representation in a second serialized cycle.

6. The method of claim 5, wherein the providing detection signals asserted for greater than two failing data outs includes asserting a signal for asserting a multi-bit row signal, the signal asserted when a number of simultaneously failing data outs exceed a number of column group repairable or redundant elements in a memory array.

* * * * *